United States Patent
Suzuki et al.

(10) Patent No.: US 6,307,299 B1
(45) Date of Patent: Oct. 23, 2001

(54) METHOD OF CORRECTING A RESONANCE FREQUENCY OF A SMALL ROTARY ACTUATOR

(75) Inventors: Mizuaki Suzuki; Kazuo Tani, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/201,181

(22) Filed: Nov. 30, 1998

(51) Int. Cl.[7] .................................................. H01L 41/08
(52) U.S. Cl. ...................... 310/312; 310/321; 310/323.02
(58) Field of Search .................................... 310/312, 330, 310/331, 332, 329, 337

(56) References Cited

U.S. PATENT DOCUMENTS

| | | | |
|---|---|---|---|
| 3,716,828 | * | 2/1973 | Massa ............................... 310/337 X |
| 4,004,166 | * | 1/1977 | Nakata ................................. 310/312 |
| 4,379,244 | * | 4/1983 | Dinger ................................. 310/312 |
| 4,385,473 | * | 5/1983 | Aoki ................................. 310/312 X |
| 4,455,500 | * | 6/1984 | Savit et al. ............................ 310/312 |
| 4,505,014 | * | 3/1985 | McNeel et al. ................... 310/312 X |
| 5,414,320 | * | 5/1995 | Mashio ............................. 310/312 X |
| 5,850,117 | * | 12/1998 | Tobe et al. ............................ 310/312 |
| 5,986,385 | * | 11/1999 | Atsuta ............................... 310/312 X |

FOREIGN PATENT DOCUMENTS 60-123106    7/1985   (JP) .
03-285575   12/1991   (JP) .

* cited by examiner

*Primary Examiner*—Mark O. Budd
(74) *Attorney, Agent, or Firm*—Adams & Wilks

(57) ABSTRACT

In a small rotary actuator having a rotor and a plurality of oscillators, each having a piezoelectric element that is excited by application of energy thereto so that the piezoelectric element oscillates at a resonance frequency thereof, the resonance frequency of the respective oscillators varies to some degree. This variation reduces the efficiency of rotation of the rotor. In order to reduce this variation, one or more of the piezoelectric elements of the oscillators is etched so that its resonance frequency is increased to match the resonance frequency of the other oscillators.

22 Claims, 6 Drawing Sheets

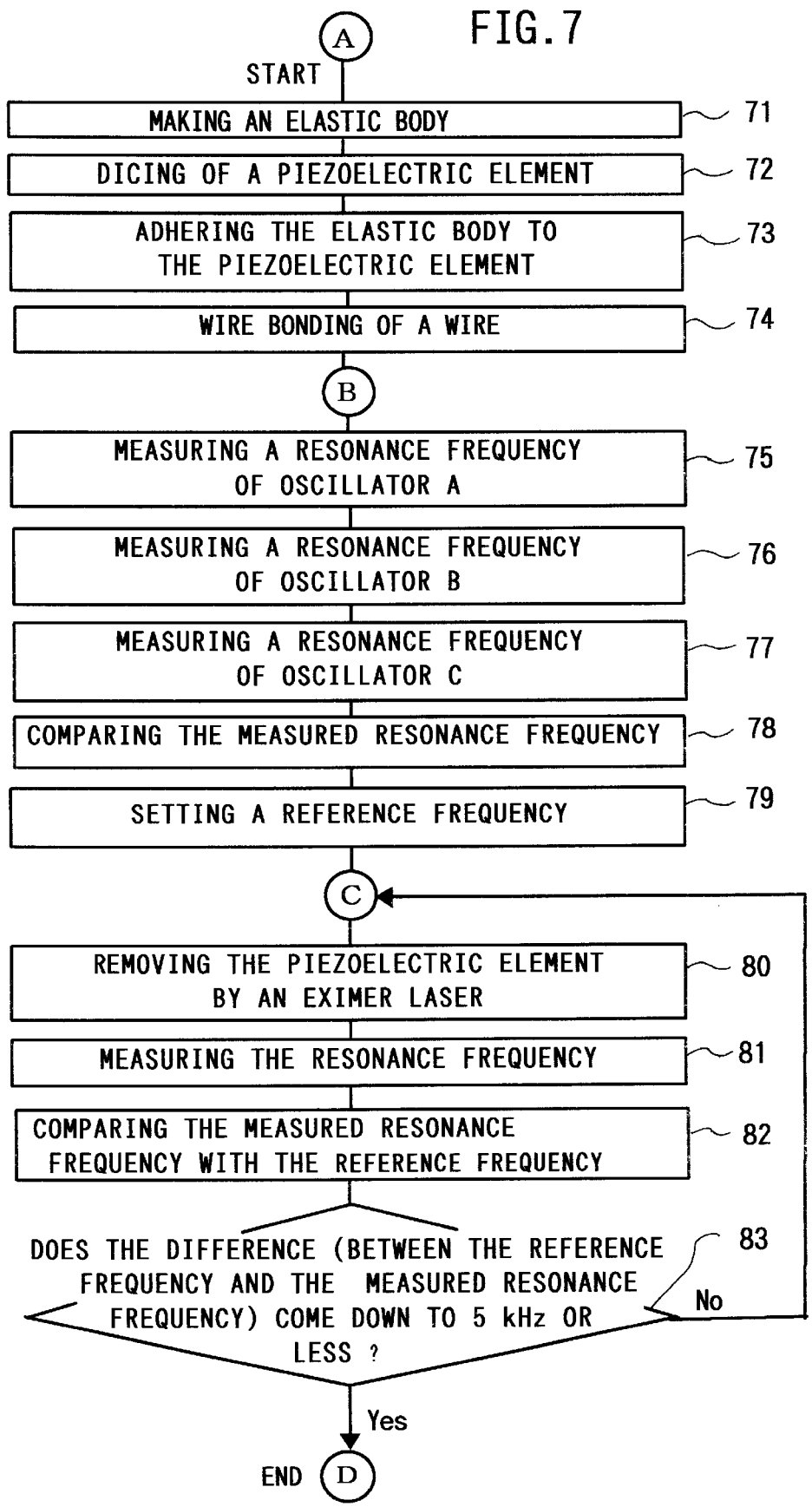

METHOD OF CORRECTING A RESONANCE FREQUENCY OF A SMALL ROTARY ACTUATOR

BACKGROUND OF THE INVENTION

The present invention relates to a method of correcting a resonance frequency of a small rotary actuator which is used as a power means for clocks, cameras, tools, automatic assembling devices, accurate X-Y stages or the like.

Conventionally, in the case of manufacturing a small rotary actuator having a plurality of oscillators, in order to reduce a variation in a resonance frequency of the respective oscillators, there has been applied a method in which an accuracy in machining of the oscillators is improved and in which a piezoelectric element is improved through a higher accuracy process technology, or a manner in which only an excellent performing rotary actuator is selected from a plurality of rotary actuators. However, there is a limit to improving a machining accuracy, and also there arises a problem in that a yield is lowered to deteriorate productivity in the manner where only the most accurate rotary actuator is selected.

In the case where the oscillator is driven by using a piezoelectric element such as a PZT, the efficiency is the highest when the oscillator is driven with an a.c. voltage a frequency of which is identical with its resonance frequency. When the oscillator is driven with an a.c. voltage a frequency of which is different from the resonance frequency of the oscillator, a very large voltage must be applied to the oscillator, thus providing a low efficiency. When the frequency of the a.c. voltage is largely different from the resonance frequency of the oscillator, it is impossible to drive the oscillator.

In a rotary actuator of the type in which a rotary torque is produced due to continuous impact caused by the vibrations of the oscillator to drive a rotor, a large rotary torque can be obtained by providing and driving a plurality of oscillators at the same time. However, in the prior art, it is difficult to obtain an oscillator having an accurate desired resonance frequency when a small rotary actuator having a plurality of vibrators is fabricated, because the resonance frequencies are largely varied among the respective oscillators. As a result, when the oscillators are intended to be driven with an a.c. voltage a frequency of which is suitable for one oscillator, other oscillators different in resonance frequency cannot be driven, and thus the efficiency of rotation cannot be improved.

In order to reduce a variation in resonance frequency of the oscillators by improving the machining accuracy of the oscillators and the piezoelectric element, the manufactured devices and the manufacturing processes need to be improved, and the costs cannot be prevented from largely increasing. As a result, it is difficult to manufacture a highly efficient actuator.

SUMMARY OF THE INVENTION

The present invention has been made in order to solve the above problems, and therefore an object of the present invention is to provide a method of correcting a resonance frequency of a small rotary actuator which efficiently generates a large torque.

In order to achieve the above object, according to the present invention, there is provided a method of correcting a resonance frequency of a small rotary actuator in which the frequency is corrected by cutting a piezoelectric element using a laser beam, an ion beam or plasma to reduce a variation in the resonance frequencies of a plurality of oscillators.

Also, according to the present invention, the resonance frequency is corrected while measuring the resonance frequency of the oscillators by conducting electric measurement through an impedance analyzer of measurement through a laser Doppler vibrometer.

BRIEF DESCRIPTION OF THE DRAWINGS

These and other objects, features and advantages of this invention will become more fully apparent from the following detailed description taken with the accompanying drawings in which:

FIG. 7 is a flowchart showing a process of the resonance frequency correcting method in accordance with the present invention.

DETAILED DESCRIPTION OF THE PREFERRED EMBODIMENT

Now, a description of a preferred embodiment of the present invention will be given in more detail with reference to the accompanying drawings.

Figure 1:
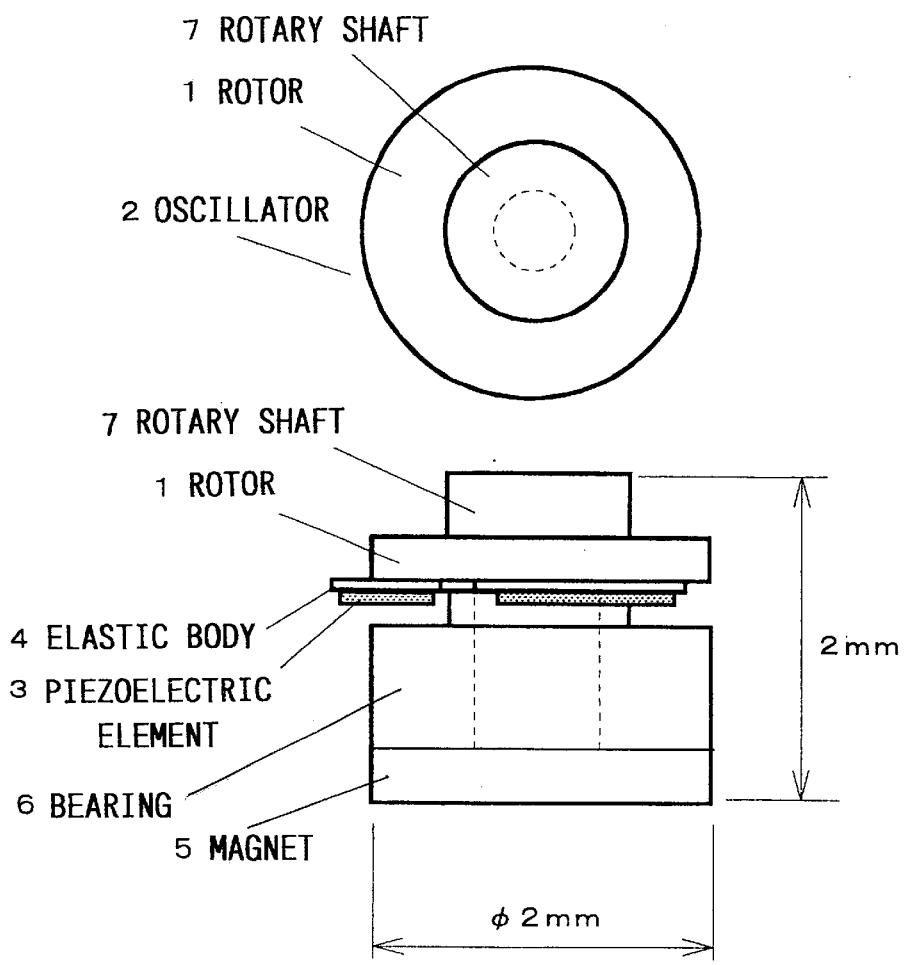
FIG. 1 is a diagram showing the structure of a small rotary actuator in accordance with an embodiment of the present invention.

First of all, a rotary actuator to which a piezoelectric element is applied will be described. FIG. 1 schematically shows the structure of a small rotary actuator in accordance with an embodiment of the invention.

The rotary actuator of the present invention includes a rotor 1 that serves as a rotor in a normal supersonic wave motor, and a plurality of oscillators 2. Each of the oscillators 2 is made up of a piezoelectric element 3 formed of a PZT ceramics material which causes stretching vibration action due to the application of an a.c. voltage or a crystal material such as lithium noibate or lithium tantalate, and an elastic body 4 made of stainless steel or copper alloy that has no piezoelectric effect and does not cause stretching action. The piezoelectric element 3 is bonded onto the elastic body 4 with an adhesive.

The piezoelectric element 3 causes the stretching vibration action by the application of the a.c. voltage whereas the elastic body 4 is not stretched. As a result, deflection is developed in the oscillators 2 structured by bonding those members together, thereby producing vibrations in synchronism with the applied a.c. voltage. Since the oscillators are of the cantilever type, a deflection is developed, and the vibration movement of their top portions have not only a vertical component but also a horizontal component that gives a rotary torque to the rotor 1. The rotary torque is developed by continuously impacting the top portions of the oscillators 2 on the back surface of the rotor 1, to thereby obtain the rotary action. The rotary actuator is normally designed in such a manner that the rotor 1 and the oscillators 2 are brought in close contact with each other by the attraction of a spring or a magnet 5 so that the impact of the oscillators 2 is effectively transmitted to the rotor 1. In the case where the magnet 5 is used, ion material may be used for the rotor 1.

In the rotary actuator having the above-described operational principle, in order to obtain a largely generated torque, although a plurality of oscillators 2 are provided with respect to one rotor 1, the respective resonance frequencies of the plural oscillators 2 do not always coincide with each other. Although the oscillators 2 have an inherent frequency, the resonance frequencies of the oscillators 2 are varied depending on an accuracy in dimension and adhesive strength of the piezoelectric element 3 and the elastic body 4. If a difference in resonance frequency between the plurality of oscillators 2 is large, when an a.c. voltage whose frequency is made identical with the resonance frequency of one oscillator 2 is applied to the respective oscillators, other oscillators 2 may provide only remarkably small amplitudes (vibration displacements) or hardly conduct vibration actions. When such a deficiency occurs, the oscillators 2 that do not conduct vibration do not develop a rotary torque and also produce a frictional resistance to impede the rotary action.

It is not impossible for individual a.c. power supplies to be given to the respective oscillators 2 each having a different resonance frequency for the purpose of preventing a problem of the variation of the resonance frequencies. However, since the rotor 1 is impacted by a plurality of vibrations which are different in frequency and are phase and not synchronous with each other, an expected improvement in efficiency cannot be obtained. In addition, the use of plural power supplies causes the costs to increase.

The most effective means for essentially solving the above problems is that the piezoelectric element 3 for driving the oscillators 2 is accurately cut by a convergent beam such as a laser beam, and a variation in the resonance frequencies of the oscillators 2 is corrected.

FIG. 1 schematically shows the structure of a small rotary actuator in accordance with an embodiment of the present invention. The small rotary actuator according to this embodiment is made up of a bearing 6, oscillators 2, a rotor 1 and a rotary shaft 7. The size of the small rotary actuator according to this embodiment is about 2 mm in diameter. The bearing 6 and the rotor 1 are machined in a cylindrical configuration and a disc configuration, respectively, and their material in non-magnetic stainless steel. The oscillators 2 and the bearing 6 are joined to each other through a brazing technique. The material of the rotary shaft 7 is steel, and its surface is subjected to flourocarbon resin coating process for the purpose of achieving anti-corrosion, friction resistance and the reduction of frictional resistor. The diameter of the shaft is 0.5 mm. The rotary shaft 7 is inserted into the rotor 1.

Figure 2:
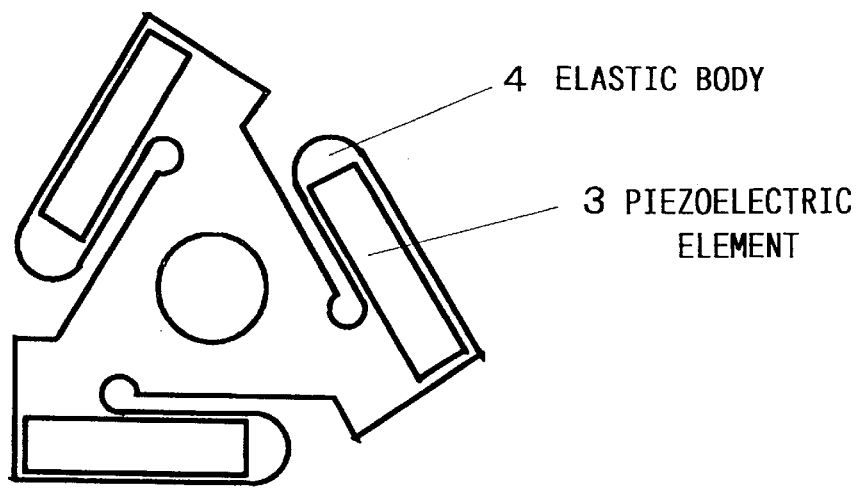
FIG. 2 is a diagram showing the structure of an oscillator in accordance with the present invention.

FIG. 2 is a diagram schematically showing the structure of the oscillator 2. The small rotary actuator according to this embodiment includes three oscillators 2 which are arranged rotationally symmetrically with respect to the rotary shaft 7. The effect of the present invention is effective even to the small rotary actuator having two, four, or more oscillators. The oscillator 2 is made up of an elastic body 4 and an piezoelectric element 3. The material of the piezoelectric element 3 is PZT (titanate zirconate) ceramic which is generally referred to herein as "piezoelectric material". The piezoelectric material normally has the piezoelectric effect that the material stretches by the application of a voltage, and because PZT ceramic has a particularly high stretching characteristic, it is widely applied to a piezoelectric actuator including a supersonic wave motor. The piezoelectric material 3 used in the small rotary actuator according to this embodiment is formed by machining a bulk material of PZT ceramic into a plate material of 120 μm in thickness through lapping grinding and cutting it into rectangular chips of 1.3 mm×0.35 mm by a dicing saw (wafer cutter). An aluminum thin film of 1500 Å in thickness is deposited on the piezoelectric element 3 for the purpose of protecting a metal electrode and a PZT material surface. Also, a polarizing process is conducted for producing the piezoelectric effect. The elastic material 4 is machined through photo fabrication and etching method, and its material is non-magnetic stainless steel of 0.1 mm in thickness. The piezoelectric element 3 adheres to the elastic body 4 with an epoxy adhesive. An electric wiring is made on the metal electrode 8 of the piezoelectric element 3 surface by using a supersonic wave type wire bonder device, where a voltage for driving the piezoelectric element 3 can be applied.

When an a.c. voltage is applied to the piezoelectric element 3 of the small rotary actuator according to this embodiment by an oscillator which is an a.c. power supply, it stretches in a facial direction according to the positive/negative level of the voltage. However, since the elastic body 4 adhered to the piezoelectric element 3 does not stretch, the oscillator 2 is deflected upward when the piezoelectric element 3 expands whereas the oscillator 2 is deflected downward when the piezoelectric element 3 contracts. These operations continue so that the top portions of the oscillators 2 vibrate vertically while being reflected. The top portions of the oscillators 2 are large in amplitude whereas the other ends thereof which are fixed to the bearing 6 are small in amplitude.

Figure 3:
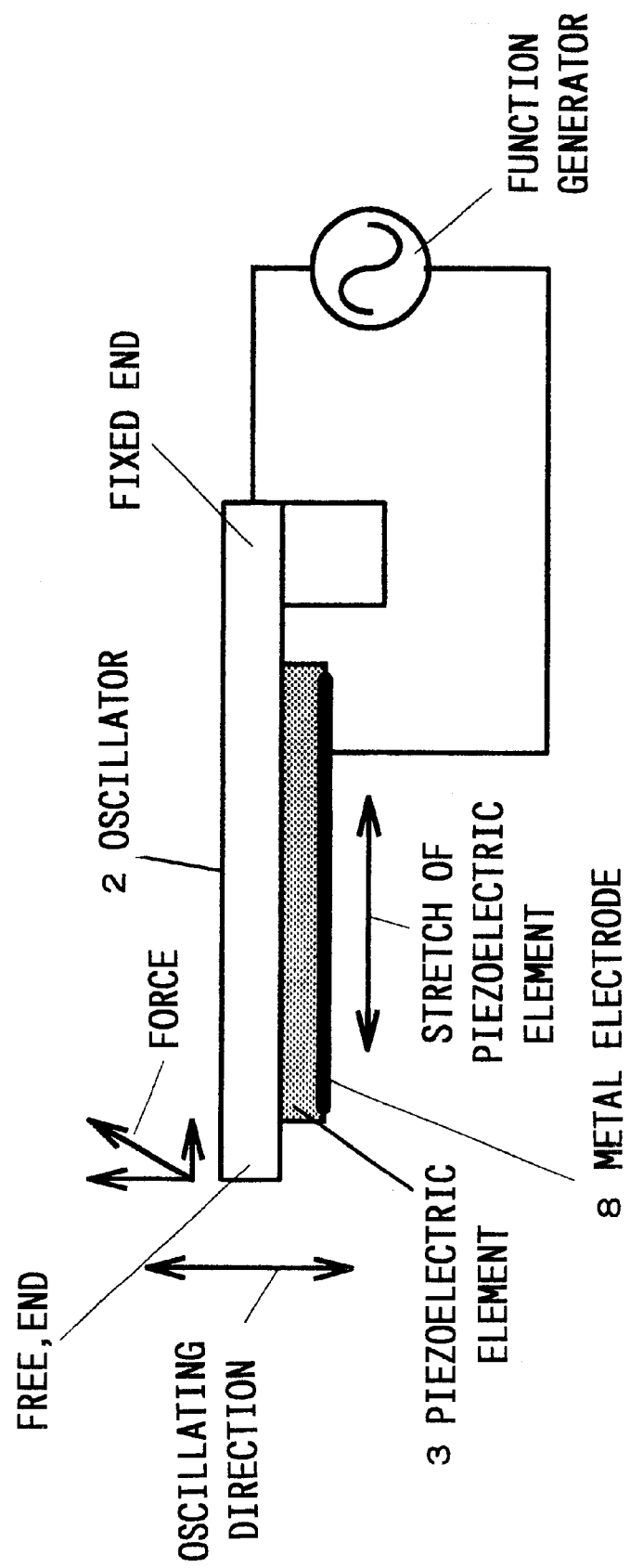
FIG. 3 is a diagram showing the operation of the oscillator in accordance with the present invention.

FIG. 3 shows the outline of the operation of the oscillators. The oscillators vibrate with a high efficiency by the largest amplitude when an a.c voltage of a frequency identical with the resonance frequency of the oscillator is given to the oscillators.

An impedance analyzer is connected to the oscillator 2 of the above-described small rotary actuator according to this embodiment, and the resonance frequency was electrically measures. When the admittance of the oscillator 2 is measured while scanning the frequency of the a.c. voltage input from the impedance analyzer, the admittance has a large peak at a certain frequency. The frequency at this time is the resonance frequency of the oscillator 2.

Figure 4:
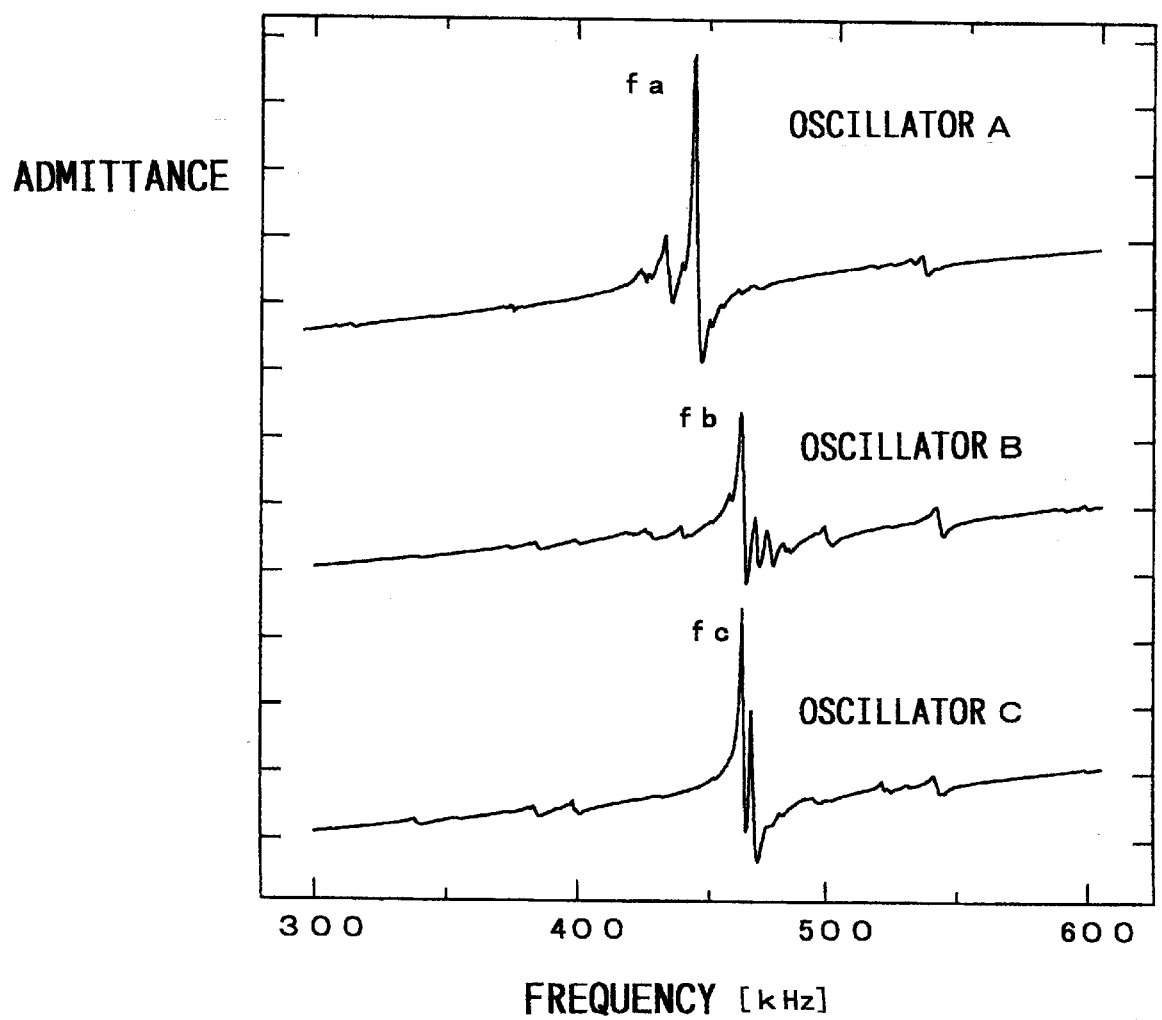
FIG. 4 is a graph showing the resonance frequency of the oscillator in accordance with the present invention.

FIG. 4 shows an example in which the resonance frequency of the oscillator 2 of the small rotary actuator according to this embodiment was measured. Since the small rotary actuator according to this embodiment has three oscillators 2, they are distinguished as oscillator A, oscillator B and oscillator C. The horizontal axis represents the frequency (kHz) of the a.c. voltage input from the impedance analyzer, and the vertical axis represents the admittance (arbitrary unity) exhibiting the tendency of a current flow. The sharp peak exhibits the resonance frequency of the oscillators 2 where a power is efficiently converted into the vibration energy of the oscillators 2 at that frequency. A method using the about-described impedance analyzer is easy to measure the resonance frequency, but the amplitude (vibration displacement amount) of the oscillators may be measures using the laser Doppler vibrometer. The frequency at which the largest amplitude is obtained is the resonance frequency. As to the principle of the laser Doppler vibrometer, etc., refer to the magazine "Measuring Technology", '91-No. 10.

An oscillator is connected to the oscillators 2 of the small rotary actuator before the resonance frequency of the oscillators 2 is corrected, and an a.c. voltage of 460 Hz close to the resonance frequencies of the oscillators B and C was applied to the oscillators. When the output voltage of the Function Generator (F.G.) is 5 Vpp, the rotor 1 does not rotate, but when the output voltage increases up to 10 Vpp, the rotor 1 rotates at about 100 rpm.

In the measurement shown in FIG. 4, because the variation in the resonance frequencies of the oscillators 2 of the small rotary actuator according to this embodiment is not corrected, it is found that the resonance frequency of the oscillator A is slightly lower than that of the oscillator B and the oscillator C. In general, the vibration piece of the cantilever type is lower in frequency as its length becomes longer, and the resonance frequency becomes higher as the vibration piece becomes shorter. Accordingly, if correction is made in such a manner that the length of the piezoelectric element 3 of the oscillator A is machined so as to be shortened so that the resonance frequency becomes high, the variation in the resonance frequency of the three oscillators 2 can be reduced.

In the accurate work where the resonance frequency of the oscillator 2 of the small rotor actuator of about several mm in size, as in this embodiment, is corrected, as mechanical cutting process such as a milling machine is not proper. The use of brittle material such as PZT ceramics, which is material of the piezoelectric element 3, generally makes the mechanical cutting process difficult. Also, it is difficult to firmly fix the oscillators 2 of the small rotary actuator of the present invention of the purpose of conducting a mechanical milling process. Thus, it is necessary to use a beam processing method such as a laser beam or an ion beam.

Figure 6:
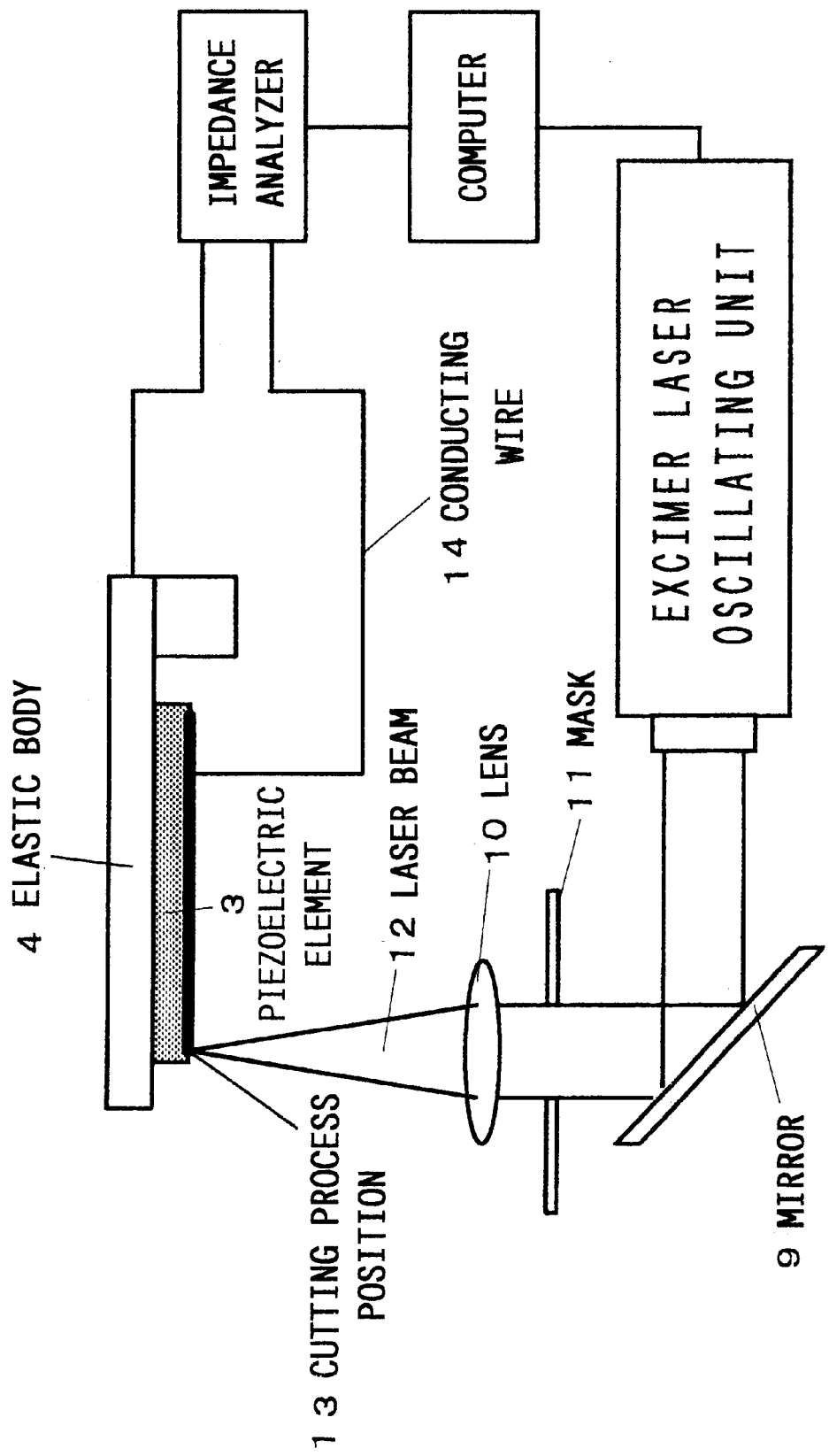
FIG. 6 is a diagram showing a method of correcting the resonance frequency in accordance with the present invention.

FIG. 6 schematically shows a method of machining a piezoelectric element using an excimer laser of the small rotary actuator according to this embodiment. The small rotary actuator is fixed on an X-Y stage so that a position at a which laser machining is made can be accurately corrected. An impedance analyzer is connected to the oscillators 2 so that the resonance frequency of the oscillators 2 can be measured during the machining. An excimer laser was used as a machining laser because it is small in thermal influence. A laser beam emitted from an excimer laser oscillating unit is reflected by a mirror 9, then focused by a lens 10 and a mask 11 having a open slit, and reaches the piezoelectric element 3 so that the laser beam evaporates a part of the piezoelectric element 3 for machining. In this embodiment, the energy of the laser beam was set to 600 mJ, the laser beam repellant frequency was set to 50 Hz, and the resonance frequency of the oscillators 2 was measures by the impedance analyzer every 100 shots of laser pulse irradiation.

Figure 5:
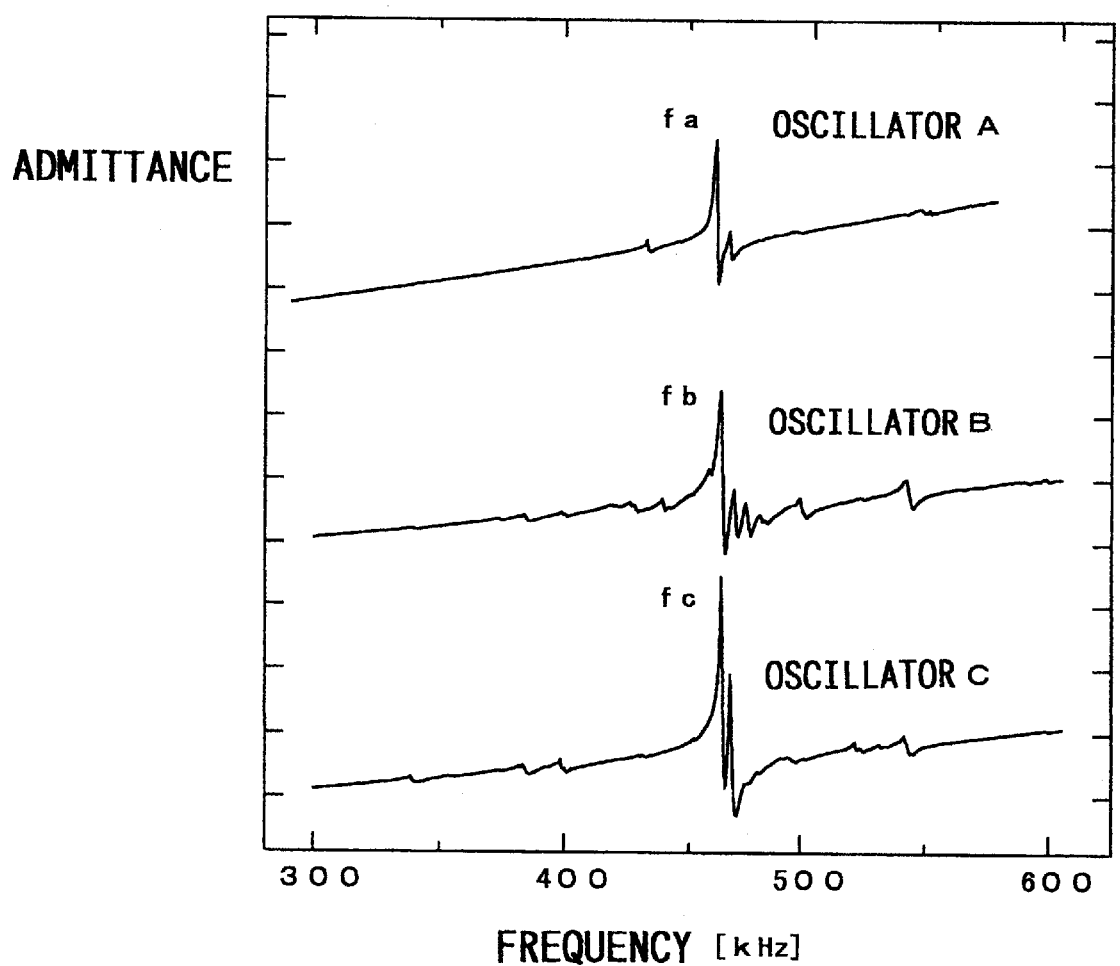
FIG. 5 is a graph showing the resonance frequency of the oscillator which has been corrected in accordance with the present invention.

FIG. 5 shows the above-described corrected resonance frequency of the oscillators. The resonance frequency of the oscillator A becomes high by the laser machining so as to be close to that of the oscillator B and the oscillator C. As a result, the variation is reduced.

The method of correcting the frequency as described above is shown in a flowchart. In the flowchart, the manufacture of the oscillators is shown in (A) to (B), and the method of correcting the frequency of the oscillators is shown in (B) to (D).

FIG. 7 is a diagram showing a process of the correcting method in accordance with the present invention. First, an elastic body is made from a metal plate such as stainless steel through an etching technique, and a piezoelectric ceramic material (piezoelectric body) is cut out with a dicing technique to fabricate a piezoelectric element. Then, the elastic body is made to adhere to the piezoelectric element to form an oscillator. A metal conducting wire is wire-boned to the metal electrode of the piezoelectric element surface to form a wire to which a voltage for exciting the refractory vibration is applied.

In the oscillator thus manufactured, its resonance frequency is corrected in processes subsequent to the process (B). Beforehand, the respective resonance frequencies of three oscillators A, B and C are measured. In the measurement of the resonance frequency, an impedance analyzer or a laser Doppler vibrometer is used. The highest one of the measured resonance frequencies is selected as a reference frequency. This is because, in the case where the piezoelectric element is removed by the excimer laser, since the dimension is shortened and the resonance frequency becomes high, correction for lowering the frequency is impossible. Specifically, assuming that the resonance frequencies of the oscillators A, B and C are fa, fb and fc, for example, in the case where the frequency fa is the highest, the frequencies of the oscillators B and C are corrected to reduce differences among those three frequencies. The piezoelectric element of the refractor vibrator B is removed by the excimer laser, and the resonance frequency fb is again measured. Then, the frequency correcting process subsequent to (C) of FIG. 7 is repeated until the difference between the resonance frequency fa of the oscillator A and the resonance frequency fb of the oscillator B comes down to 5 kHz or less. Then, the process subsequent to (C) is implemented with respect to the oscillator C.

It is possible that the above process is automatically driven through programming by connecting computer to the impedance analyzer using a digital interface mechanism such as GP-IB.

As described above, as a result that the oscillator is connected to the small rotary actuator where the resonance frequency of the oscillator 2 has been corrected according to this embodiment, and an a.c. voltage of 460 kHz is given to the actuator, the rotation of about 90 rpm was obtained at 5 Vpp. When the output voltage of the F.G. is 10 Vpp, the rotation of 200 rpm or higher was obtained. The present invention can realize a small rotary actuator higher in efficiency than a case where the resonance frequency of the oscillator 2 is not corrected.

As described above, the present invention can realize an excellent rotary actuator which efficiently generates a torque even if the actuator is of a small size such as several mm in diameter, with the correction of the resonance frequency of the oscillator.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of correcting the resonance frequency of a small rotary actuator having a rotor and a plurality of oscillators each having a piezoelectric element and being excited by applying energy to the piezoelectric element to cause oscillation of the respective oscillators at a resonance frequency thereof, in which a torque is supplied to the rotor by virtue of the oscillators impacting the rotor due to vibration of the oscillators, comprising the step of: cutting the piezoelectric element for driving one or more of the oscillators in order to reduce a variation in resonance frequency of the respective oscillators to improve the efficiency of rotation of the rotary actuator.

2. A method of correcting the resonance frequency of a small rotary actuator according to claim 1; wherein the step of cutting to reduce a variation in resonance frequency of the respective oscillators is performed using a laser beam.

3. A method of correcting the resonance frequency of a small rotary actuator according to claim 1; wherein the step of cutting to reduce a variation in resonance frequency of the respective oscillators is performed using one of an ion beam, a grain beam and a plasma.

4. A method of correcting the resonance frequency of a small rotary actuator according to either claim 2 or claim 3; wherein the highest one of the resonance frequencies of the plurality of oscillators is set as a reference frequency, and at least one of the other piezoelectric elements of the oscillator is cut until a difference between the reference frequency and the resonance frequencies of the other oscillators is within 5 kHs.

5. A method of reducing a variation in resonance frequency in a rotary actuator having a rotor and three or more piezoelectric oscillators, comprises the steps of:

providing the three or more oscillators in rotary symmetry with respect to the rotor, each of the oscillators having a piezoelectric element oscillated by the application of energy at a resonance frequency thereof so as to apply a torque to the rotor by impacting the rotor, and each oscillator having a resonance frequency which varies in accordance with its size;

selecting a reference frequency as the resonance frequency of one of the respective oscillators;

changing the size of at least one of the other oscillators to reduce a variation in resonance frequency of the respective oscillators so that each of the oscillators has the desired resonance frequency to improve the efficiency of movement of the actuator.

6. A method according to claim 5; wherein the step of providing a plurality of oscillators comprises the step of providing a plurality of cantilever type piezoelectric oscillators, the resonance frequency of the respective piezoelectric oscillators being directly proportional to the size thereof.

7. A method according to claim 6; wherein the step of selecting a reference frequency comprises the step of selecting the resonance frequency of one of the plural piezoelectric oscillators having the smallest size.

8. A method according to claim 7; wherein the step of changing the size of the other oscillators comprises the step of etching the other piezoelectric oscillators so that the resonance frequencies thereof are increased and the variation in resonance frequency among the plural oscillators is reduces.

9. A method according to claim 8; wherein the step of etching is performed using a laser.

10. A method according to claim 9; wherein the laser is an excimer laser.

11. A method according to claim 8; wherein the step of etching is performed using an energy beam.

12. A method according to claim 8; wherein the step of etching is performed in a plasma.

13. A method according to claim 6; wherein the piezoelectric oscillators have a characteristic of being responsive to an applied a.c. voltage to undergo stretching vibration.

14. A method according to claim 13; wherein the plural oscillators comprise an oscillator section of a rotary actuator and are vibrated at the resonance frequencies thereof when in use to impact a rotor to cause rotary motion thereof.

15. A method according to claim 14; wherein the piezoelectric are formed of a PZT ceramic.

16. A method of correcting the resonance frequency of a small rotary actuator according to claim 1; wherein the plurality of oscillators comprise a plurality of cantilever type piezoelectric oscillators, the resonance frequency of the respective piezoelectric oscillators being directly proportional to the size thereof.

17. A method of correcting the resonance frequency of a small rotary actuator according to claim 16; wherein the piezoelectric oscillators are responsive to an applied a.c. voltage to undergo stretching vibration.

18. A method of correcting the resonance frequency of a small rotary actuator according to claim 1; wherein the resonance frequency of one of the plurality oscillators having the smallest size is set as a reference frequency, and the piezoelectric element of at least one of the other oscillators is cut so that the resonance frequency thereof is increased and the variation in resonance frequency among the plural oscillators is reduced.

19. A method of correcting the resonance frequency of a small rotary actuator according to claim 1; wherein the step of cutting to reduce a variation in resonance frequency of the respective oscillators is performed using an energy beam.

20. A method of correcting the resonance frequency of a small rotary actuator according to claim 1; wherein the step of cutting to reduce a variation in resonance frequency of the respective oscillators is performed in a plasma.

21. A method of correcting the resonance frequency of a small rotary actuator according to claim 1; wherein the piezoelectric oscillators are formed of a PZT ceramic.

22. A method of correcting the resonance frequency of a small rotary actuator according to claim 2; wherein the laser beam is produced using an excimer laser.

* * * * *